(12) United States Patent
Ding et al.

(10) Patent No.: US 7,196,648 B1
(45) Date of Patent: Mar. 27, 2007

(54) NON-INTEGER DECIMATION USING CASCADED INTERGRATOR-COMB FILTER

(75) Inventors: Lei Ding, Austin, TX (US); John L. Melanson, Austin, TX (US); Xaiofan Fei, Austin, TX (US); Johann Gaboriau, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 11/317,546

(22) Filed: Dec. 23, 2005

(51) Int. Cl.
*H03M 1/66* (2006.01)
(52) U.S. Cl. .................................... 341/144
(58) Field of Classification Search .............. 341/61, 341/118, 143, 144, 155
See application file for complete search history.

(56) References Cited

U.S. PATENT DOCUMENTS 5,982,316 A * 11/1999 Shin ........................... 341/143
6,650,258 B1 * 11/2003 Kelly et al. ................. 341/61
6,788,236 B2 * 9/2004 Erdogan et al. ............ 341/155

OTHER PUBLICATIONS

D. Babic, J. Vesma, and M. Renfors, "Decimation by irrational factor using CIC filter and linear interpolation," in Proceedings of the IEEE International Conference on Acoustics, Speech, and Signal Processing, vol. 6, 2001, pp. 3677-3680.
D. Babic and M. Renfors, "Flexible down-sampling using CIC filter with non-integer delay," in Proceedings of the IEEE International Symposium on Circuits and Systems, 2002, pp. II-285—II-288. no month.
M. Henker, T. Hentschel, and G. Fettweis, "Time-variant CIC-filters for sample rate conversion wtih arbitrary rational factors," in Proceedings of the IEEE International Conference on Electronics, Circuits and Systems, 1999, pp. 67-70. no month.
E.B. Hogenauer, "An economical class of digital filters for decimation and interpolation," IEEE Trans. Acoust. Speech, Signal Processing, vol. ASSP-29, pp. 155-162, Apr. 1981.
S. Chu and C. Burrus, "Multirate filter designs using comb filters," IEEE Trans. Circuits Syst., vol. 31, no. 11, pp. 913-924, Nov. 1984.

* cited by examiner

*Primary Examiner*—Brian Young
(74) *Attorney, Agent, or Firm*—Davis Chin; Steven Lin; Gregory S. Thomas

(57) ABSTRACT

A non-integer decimation filter for decimating an input value includes a first integrator for integrating the input value in an input sample domain at an input sample rate and for generating a first integral of the input value at its output and a second integrator for integrating the first integral of the input value in the input sample domain at the input sample rate and for generating a second integral at its output. A calculation network is coupled to the outputs of the first and second integrators for combining the outputs of the first and second integrators with corresponding coefficients to generate intermediate output values in an output sample domain. A differentiator is configured to receive the intermediate output values from the calculation network and to generate a decimated output value at an output sample rate in which the output sample rate has a non-integer factor with respect to the input sample rate.

20 Claims, 4 Drawing Sheets

US 7,196,648 B1

NON-INTEGER DECIMATION USING CASCADED INTERGRATOR-COMB FILTER

BACKGROUND OF THE INVENTION

1. Field of the Invention

This invention relates generally to decimation filters and more particularly, it relates to an improved non-integer CIC decimation filter which realizes non-integer decimation by utilizing low complexity virtual upsampling so as to eliminate the need to apply corrections to the integrators in the input sample domain.

2. Description of the Prior Art

As is generally well known in the communication industry, there have been developed over the years a number of industrial standards on audio digital sample rates. For example, there exists the 44.1 kHz sample rate for consumer CD players and the 48 kHz sample rate for professional digital audio. As a result, there has arisen the need of sample-rate conversion (SRC) systems for converting a stream of digital data at a first sample rate to a stream of digital data at a different second sample rate. It is also known in the art that decimation filters are widely used when performing this function in the field of communications and multi-media systems. However, it is often desirable for the decimation filter to support variable decimation ratios. Sometimes, these decimation ratios are non-integers.

For instance, if the modulator of a delta-sigma analog-to-digital converter (ADC) is operated at one-fourth of a master clock having a frequency of 12 MHz, as in many portable applications, the output of the modulator is required to be decimated by 62.5 in order to obtain a 48 kHz sampling rate. For achieving this non-integer decimation ratio, it is known in the prior art that this can be accomplished by using a fixed integer decimation which is either proceeded or followed by a sample rate converter. However, it is further known heretofore that a more efficient way to realize the non-integer decimation ratio is to embed the sample rate conversion in the decimation filter. In sigma-delta analog/digital converters, cascaded integrator-comb (CIC) filter arrangements are generally used for decimation.

The techniques of combining the sample rate conversion with commonly used CIC filters have been explored and developed in the past. The article by D. Babic, J. Vesma, and M. Renfors, "Decimation by irrational factor using CIC filter and linear interpolation," in *Proceedings of the IEEE International Conference on Acoustics, Speech, and Signal Processing*, Volume 6, 2001, pp. 3677–3680, describes a decimation filter consisting of parallel CIC (cascaded integrator-comb) branches with an integer decimation ratio which are employed to produce adjacent decimated samples. This is followed by a linear interpolation between the samples in order to realize non-integer decimation.

The structure of Babic et al. for non-integer decimation is shown in FIG. 1 and is labeled "Prior Art." As will be noted, the input signal u(n) is divided into polyphase components by a plurality of delay lines 2 each being connected in series with a parallel CIC filter 3 having the decimation factor of M. After the integer decimation, the irrational decimation is performed by using a linear interpolation block 4 connected between some of the two signal pairs where there is a shifting by one branch under certain conditions.

Further, the article by D. Babic and M. Renfors, "Flexible down-sampling using CIC filter with non-integer delay," in *Proceedings of the IEEE International Symposium on Circuits and Systems*, 2002, pp. II-285–II-288, discloses a decimator structure which only uses one CIC filter and implements interpolation between the integrator and comb sections of the CIC filter. This decimator structure is illustrated in FIG. 2 and is labeled "Prior Art." As can be seen, the decimator structure consists of N integrator stages 5 operating at input rate $F_{in}$, polynomial interpolation filter 6, resampler and N comb stages 7 operating at output sampling rate $F_{out}$. However, the structures of FIGS. 1 and 2 suffer from the drawback that their anti-imaging performance is limited by the interpolation.

Time-variant CIC-filters have been implemented to be completely equivalent to its original linear time-invariant system consisting of the interpolator and the decimator, as discussed in M. Henker, T. Hentschel, and G. Fettweis, "Time-variant CIC-filters for sample rate conversion with arbitrary rational factors," in *Proceedings of the IEEE International Conference on Electronics, Circuits and Systems*, 1999, pp. 67–70. In particular, the Henker et al. paper utilizes virtual upsampling and updates the integrator section of the CIC filter at the input rate. The structure of Henker et al. for a conventional time-variant CIC filter is depicted in FIG. 3 and has been labeled "Prior Art". However, this method requires a mass network for applying corrections to the state variables of the integrator due to the virtual upsampling.

CIC filters consisting of a cascade of ideal integrator stages operating at a high sampling rate and an equal number of comb stages operating at a low sampling rate are discussed in E. B. Hogenauer, "An economical class of digital filters for decimation and interpolation," *IEEE Trans. Acoust. Speech, Signal Processing*, vol. ASSP-29, pp. 155–162, April 1981.

Comb filter structures for decimators and interpolators in multistage, multirate digital structure filters are discussed in literature by S. Chu and C. Burrus, "Multirate filter designs using comb filters," *IEEE Trans. Circuits Syst.*, vol. 31, no. 11, pp. 913–924, November 1984.

Accordingly, it would be desirable to provide an improved non-integer CIC decimation filter, which eliminates the need for applying corrections to the state variables of the integrators in the input sample domain. It would also be expedient that the CIC decimation filter exhibit a much smaller gain so as to significantly reduce the word length of the datapath.

SUMMARY OF THE INVENTION

Accordingly, it is a general object of the present invention to provide an improved non-integer CIC decimation filter which overcomes all of the disadvantages of the prior art.

It is an object to provide an improved CIC decimation filter which realizes non-integer decimation by utilizing low complexity virtual upsampling so as to eliminate the need to provide corrections to the state variables of the integrators in the input sample domain.

It is another object of the present invention to provide an improved CIC decimation filter which is of a simpler design and can be implemented with relatively low computational complexity.

It is still another object of the present invention to provide an improved CIC decimation filter which includes integrators that have a relative smaller gain so as to significantly reduce the word length of the datapath.

In a preferred embodiment of the present invention, there is provided a non-integer decimation filter for decimating an input value which includes a first integrator for integrating the input value in an input sample domain at an input sample rate and for generating a first integral of the input value at an output of the first integrator and a second integrator for integrating the first integral of the input value in the input sample domain at the input sample rate and for generating a second integral at an output of the second integrator.

A calculation network is coupled to the outputs of the first and second integrators for combining the outputs of the first and second integrators with corresponding coefficients to generate intermediate output values in an output sample domain. A differentiator is configured to receive the intermediate output values from the calculation network and to generate a decimated output value at an output sample rate in which the output sample rate is a non-integer factor with respect to the input sample rate.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENTS

Figure 1:
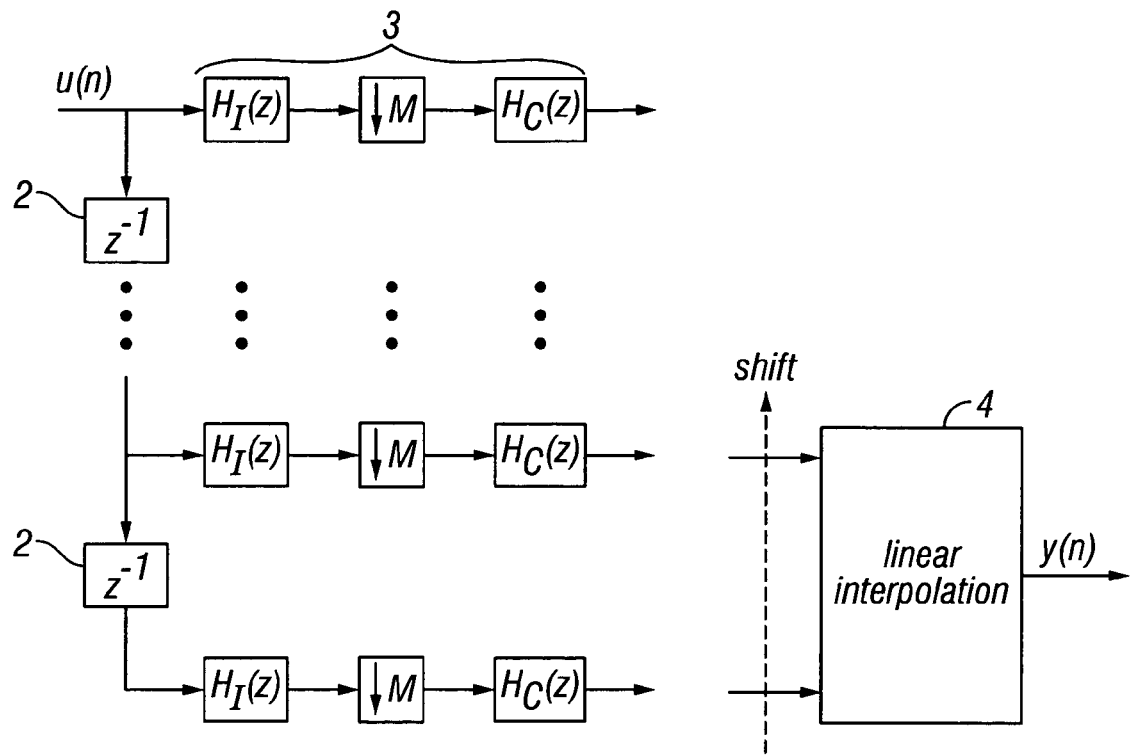
FIG. 1 shows a conventional parallel CIC filter with linear interpolation, which has been labeled "Prior Art"
Figure 2:
FIG. 2 shows a traditional CIC filter with polynomial interpolation filter, which has been labeled "Prior Art"

It is to be distinctly understood at the outset that the present invention shown in the drawings and described in detail in conjunction with the preferred embodiments is not intended to serve as a limitation upon the scope or teachings thereof, but is to be considered merely as an exemplification of the principles of the present invention.

Figure 4:
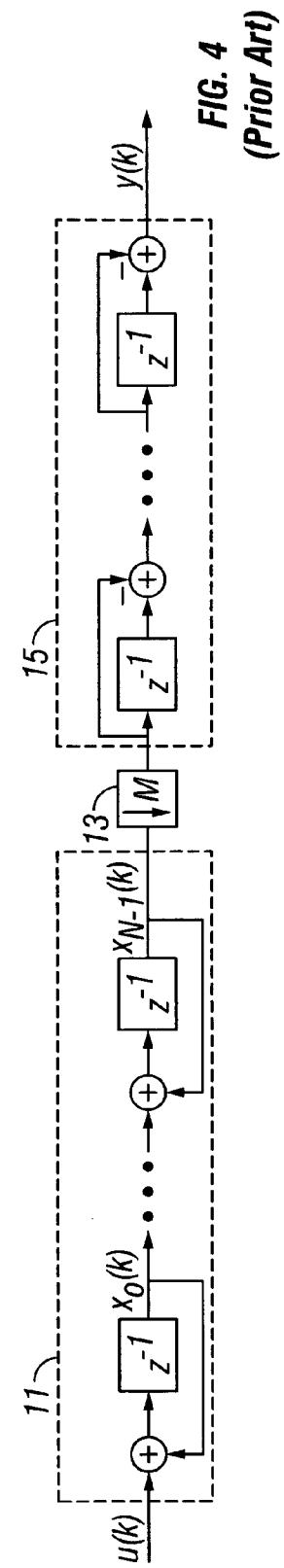
FIG. 4 is a block diagram of a conventional N-th order CIC filter arrangement.

As a background and in order to assisting in the understanding of the present invention, it is believed that it would be helpful to discuss initially the conventional N-th order cascaded integrator-comb (CIC) filter arrangement 9 in FIG. 4 prior to the detailed explanation of the present invention.

To this end, the CIC filter arrangement 9 is comprised of an input-end integrator section 11 of the n-th order, a decimator stage 13 having the integer factor M, and an output-end differentiator 15 of the n-th order. The integrator section 11 of this filter arrangement 9 can be represented by N state variables in state-space form as follows:

$$\begin{bmatrix} x_0(k) \\ x_1(k) \\ \vdots \\ x_{N-1}(k) \end{bmatrix} = \begin{bmatrix} 1 & & & \\ 1 & 1 & & \\ \vdots & & \ddots & \\ & & 1 & 1 \end{bmatrix} \begin{bmatrix} x_0(k-1) \\ x_1(k-1) \\ \vdots \\ x_{N-1}(k-1) \end{bmatrix} + \begin{bmatrix} 1 \\ 0 \\ \vdots \\ 0 \end{bmatrix} u(k-1) \quad (1)$$

The set of normal equations in equation (1) above can be written in matrix form as follows:

$$x(k) = Ax(k-1) + bu(k-1) \quad (2)$$

In order to obtain a non-integer decimation ratio defined by M/L, where L is the interpolation factor and M is the decimation factor, it is necessary to virtually upsample the input samples by interpolation factor L and then decimate the resulting sequence by the decimation factor M using the CIC filter. Initially, the state-space equations after the upsampling need to be examined. If it is assumed that after such upsampling, the integrator is represented by the matrix $A^{1/L}$ and the column vector b, then the update equations $x(kL)$ to $x(kL+L)$ are given by:

$$\begin{aligned} x(kL+1) &= A^{1/L}x(kL) + bu(kL) \\ x(kL+2) &= A^{1/L}x(kL+1) + bu(kL) \\ &\vdots \qquad \vdots \qquad \vdots \\ x(kL+L-1) &= A^{1/L}x(kL+L-2) + bu(kL) \\ x(kL+L) &= A^{1/L}x(kL+L-1) + bu(kL) \end{aligned} \quad (3)$$

In equation (3), there is assumed that the input $u(kL)$ is held L times in the upsampled domain.

These update equations can be greatly simplified by recognizing the fact that there is no need to calculate all of the samples explicitly. There is only required to calculate the value from at most one branch for each sample at the input rate (not the upsampled rate) when the factor L is less than the factor M (L<M). Therefore, the integrators of the CIC filter can be updated at the input rate and thereafter calculate only the necessary upsampled branches. By substituting each branch of the update equations sequentially in equation (3) above into the next higher branch, there is obtained the following state variable update equation at the input sampling rate, expressed as:

$$x(kL+L) = Ax(kL) + \left(\sum_{i=0}^{L-1} A^{i/L}\right) bu(kL) \quad (4)$$

In equation (4), there is made use of the fact that $(A^{1/L})^L = A$. In other words, $A^{1/L}$ can be viewed as the L-th root of the matrix A.

Similarly, by substituting the update equations sequentially in equation (3) from the first branch to the l-th branch equation, the l-th branch after virtual upsampling can be calculated by:

$$x(kL+l) = A^{l/L}x(kL) + \left(\sum_{i=0}^{l-1} A^{i/L}\right) bu(kL) \quad (5)$$

Figure 3:
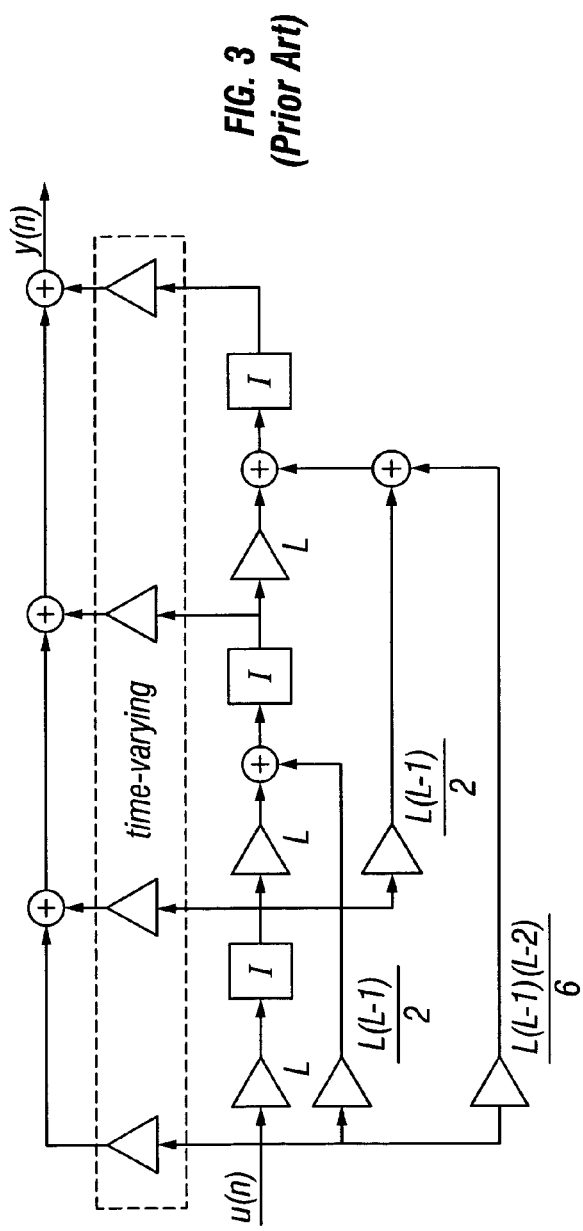
FIG. 3 illustrates a conventional time-varying CIC filter, which has been labeled "Prior Art"

For purposes of illustration and discussion, the underlying principles for the third order CIC filter will now be described. In FIG. 3 of the drawings, there is shown a time-varying CIC filter as discussed in the paper to Henker et al. It was assumed that the CIC filter in the upsampled domain follows the normal CIC filter structures without any coupling between integrators I. Then, Henker et al. derives the equivalent structure at the input rate, in which every integrator I needs corrections from all the preceding integrators and the input. For example, at the upsampled rate, a normal 3-rd order CIC filter can be represented by:

$$A^{1/L} = \begin{bmatrix} 1 & 0 & 0 \\ 1 & 1 & 0 \\ 0 & 1 & 1 \end{bmatrix} \text{ and} \quad (6)$$

$$b = \begin{bmatrix} 1 \\ 0 \\ 0 \end{bmatrix}. \quad (7)$$

By substituting above equations (6) and (7) into equation (4), the state variable update equation is given as follows:

$$x(kL+L) = \begin{bmatrix} 1 & 0 & 0 \\ L & 1 & 0 \\ \frac{L(L-1)}{2} & L & 1 \end{bmatrix} x(kL) + \begin{bmatrix} L \\ \frac{L(L-1)}{2} \\ \frac{L(L-1)(L-2)}{6} \end{bmatrix} u(kL) \quad (8)$$

The magnitude response of the sample/hold upsampling and the decimation filter can be shown to be:

$$|H(e^{j\omega})| = \left| \frac{\sin\frac{M\omega}{2}}{\sin\frac{\omega}{2}} \right| \left| \frac{\sin\frac{L\omega}{2}}{\sin\frac{\omega}{2}} \right| \quad (9)$$

It should be noted that the following useful information is evident from the above expressions (8) and (9): Equation (8) indicates that every state variable of the integrators needs corrections from both the preceding integrators and the inputs. When the order of the CIC filter becomes large, the correction network can have a very high computational complexity. Equation (9) suggests that the DC gain in the frequency response of the filter is a value of $M^3L$. However, since there is a loss of gain equal to $1/L$ during the upsampling with zero insertion, the overall gain of this CIC filter is $M^3$.

In short, the prior art to Henker et al. begins with a conventional CIC filter in the upsampled domain and then derives an equivalent structure in the input sample domain. As a result, each and every one of the integrators requires corrections from all of the preceding integrators as well as from the input. In order to perform these corrections, there is required a greatly increased amount of coefficient memory size and a high computational complexity. Unlike Henker et al., the integrators of present invention are updated in the input sample domain without any corrections to the state variables and thus are very simple in their construction. The present integrators perform an integral of the input sample by assuming a conventional CIC filter in the input sample domain. Then, the coefficients for combining the outputs of the integrators at the output sample rate are derived. Therefore, the significant amount of computational power expended in Henker et al., which is provided by large amounts of hardware, has been eliminated in the present invention.

Figure 5:
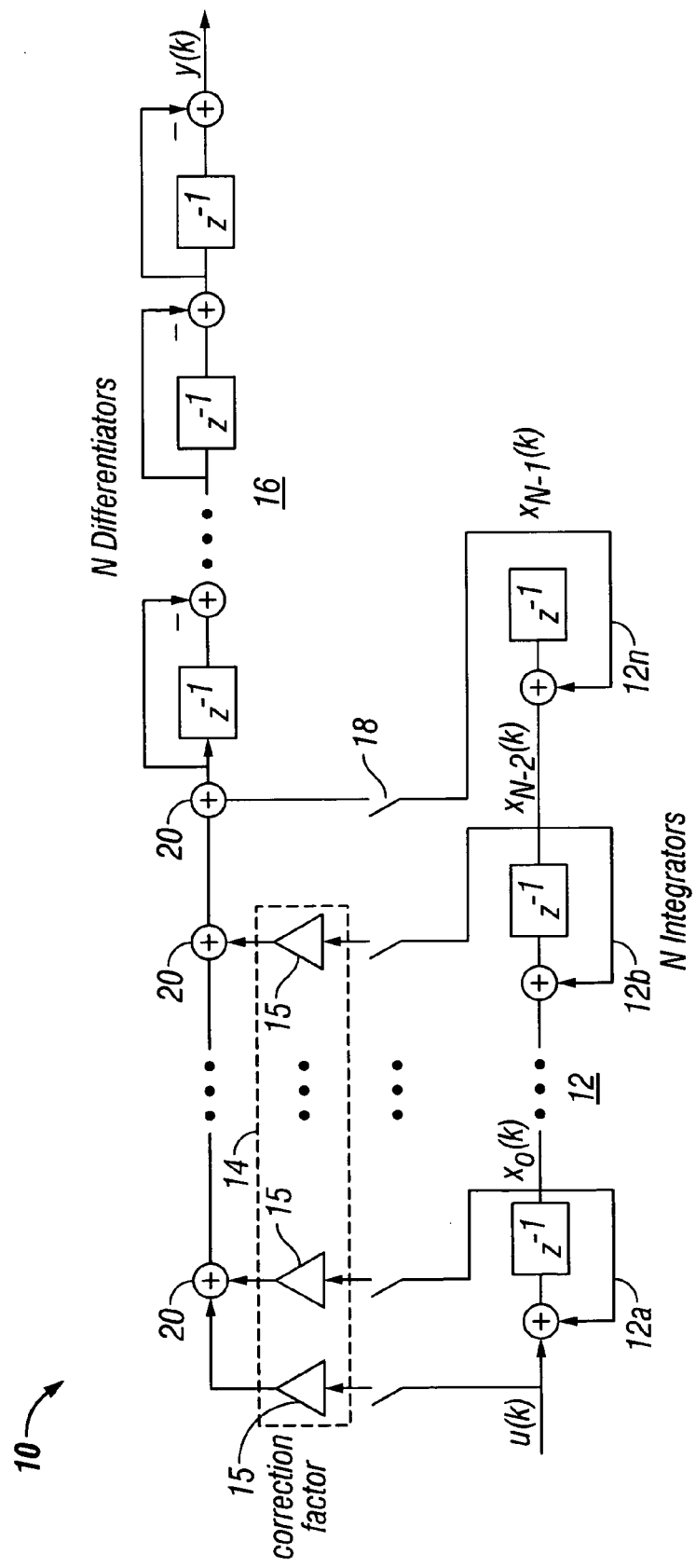
FIG. 5 is a block diagram of an improved non-integer CIC decimation filter, constructed in accordance with the principles of the present invention.

With reference now in detail to the drawings, there is illustrated in FIG. 5 a simplified block diagram of an improved non-integer cascaded integrator-comb (CIC) decimation filter 10, constructed in accordance with the present invention. The present approach starts by defining a desired CIC filter structure at the input rate. It arrives at a coupled CIC filter structure in the upsampled domain. However, since the upsampling is virtual, there is no need to implement the structure in the upsampled domain. Therefore, a simple CIC filter can be implemented at the input sample rate. Based on the state variables of this simple CIC filter, there is calculated the final decimated output by multiplying each state variable with its own coefficient and summing them together.

For example, in the case of 3-rd order CIC filters, the desired state update equations are selected first by specifying A and $$\sum_{i=0}^{L-1} A^{i/L} b.$$

Then, the corresponding $A^{1/L}$ and b are derived and equation (5) is used to calculate the output of the integrator.

For example, by selecting the following:

$$A = \begin{bmatrix} 1 & 0 & 0 \\ 1 & 1 & 0 \\ 0 & 1 & 1 \end{bmatrix} \quad (10)$$

And $$\left( \sum_{i=0}^{L-1} A^{i/L} \right) b = \begin{bmatrix} 1 \\ 0 \\ 0 \end{bmatrix} \quad (11)$$

Then, there are given:

$$A^{1/L} = \begin{bmatrix} 1 & 0 & 0 \\ \frac{1}{L} & 1 & 0 \\ \frac{1-L}{2L^2} & \frac{1}{L} & 1 \end{bmatrix} \quad (12)$$

And $$b = \begin{bmatrix} \frac{1}{L} \\ \frac{1-L}{2L^2} \\ \frac{(1-L)(1-2L)}{6L^3} \end{bmatrix} \quad (13)$$

The state update equations in this case have the standard integrator form, i.e., $$x(kL+L) = \begin{bmatrix} 1 & 0 & 0 \\ 1 & 1 & 0 \\ 0 & 1 & 1 \end{bmatrix} x(kL) + \begin{bmatrix} 1 \\ 0 \\ 0 \end{bmatrix} u(kL), \quad (14)$$

which is much simpler than equation (8) above used by Henker et al., especially for high-order CIC filters. By substituting equations (12) and (13) into equation (5), the output of the virtual upsampling becomes:

$$x(kL+l) = \begin{bmatrix} 1 & 0 & 0 \\ \frac{l}{L} & 1 & 0 \\ \frac{l(l-L)}{2L^2} & \frac{l}{L} & 1 \end{bmatrix} x(kL) + \begin{bmatrix} \frac{l}{L} \\ \frac{l(l-L)}{2L^2} \\ \frac{l(l-L)(l-2L)}{6L^3} \end{bmatrix} u(kL) \quad (15)$$

The improved CIC decimation filter 10 of FIG. 5 uses the above structure contained in equations (14) and (15). The decimation filter is comprised of an integrator 12 of the n-th order, switch devices 13, calculation network 14, and a differentiator 16 of the n-th order. The input u(k) and the outputs of each integrator stage 12a, 12b through 12n defining state variables are applied to the calculation network 14 at the output sample rate by switch devices 18. The calculation network multiplies the state variables via multipliers 15 with corresponding coefficients and sums them together via adders 20. The intermediate result is sent to the differentiator 16 for generating the final decimated output y(k).

The corresponding magnitude response of this overall CIC filter in this case is:

$$|H(e^{j\omega})| = \quad (16)$$

$$\frac{1}{6L^3} \left| \frac{\sin\frac{M\omega}{2}}{\sin\frac{\omega}{2}} \right|^3 \left| \frac{\sin\frac{L\omega}{2}}{\sin\frac{\omega}{2}} \right| |(2L-1)(L-1) + 4(1-L^2)e^{-j\omega} + (2L+1)(L+1)e^{-2j\omega}|$$

The maximum gain here is $[(M^3)/(L^3)]$, which is much smaller than the gain in equation (9) used by Henker et al. Although equation (14) has the simplest implementation, the selected $$\sum_{i=0}^{L-1} A^{i/L} b$$

introduces a high-pass term to the overall frequency response given in equation (16). This term reduces the anti-aliasing performance of the decimation filter. However, by slightly increasing the complexity of the state update equation, a low-pass term can actually be introduced so as to enhance the performance of the CIC filter. In particular, by selecting:

$$A = \begin{bmatrix} 1 & 0 & 0 \\ 1 & 1 & 0 \\ 0 & 1 & 1 \end{bmatrix} \quad (17)$$

And $$\left( \sum_{i=0}^{L-1} A^{i/L} \right) b = \begin{bmatrix} 1 \\ 1 \\ \frac{2L^2+1}{12L^2} \end{bmatrix} \quad (18)$$

The magnitude response of the filter is modified to be:

$$|H(e^{j\omega})| = \frac{1}{6L^3} \left| \frac{\sin\frac{M\omega}{2}}{\sin\frac{\omega}{2}} \right|^3 \left| \frac{\sin\frac{L\omega}{2}}{\sin\frac{\omega}{2}} \right| |1 + e^{-j\omega}|^2 \quad (19)$$

All of the integrator stages in the CIC filter may have overflow since they have poles at z=1. However, the problem of overflow will not affect the results if the following two conditions are met: (1) the integrator stages are operated on a two's-complement or similar wrap-around modulo number system and (2) the most positive or negative output of the overall filter is within the range of the number system. (See p. 156 of the article by Hogenauer) For example, the output of a first order CIC filter can be written as follows:

$$y(k) = \left\langle \left\langle \sum_{i=0}^{\infty} x(k-i) \right\rangle_{R_0} - \left\langle \sum_{i=0}^{\infty} x(k-M-i) \right\rangle_{R_0} \right\rangle_R \quad (20)$$

where M represents the delay in the differentiator, and $\langle X \rangle_r$ denotes the residue of x modulo r with range in $[-r/2, r/2)$. The filter generates the correct output, i.e., $$y(k) = \sum_{i=0}^{M-1} x(k-i) \quad (21)$$

only when $$R_0 = R \text{ and } \sum_{i=0}^{M-1} x(k-i) \in [-R/2, R/2).$$

(See p. 917 in the paper by Chu et al.)

For a conventional 3rd-order CIC filter, the output of the integrator section is:

$$\langle x_2(k) \rangle_R, \quad (22)$$

where R is the modulo of all of the integrators and differentiators. On the other hand, for the improved CIC decimation filter 10 of FIG. 5, the output of the integrator section is given by:

$$\left\{ \frac{l(l-L)(l-2L)}{6L^3} \langle u(k) \rangle_{R_u} + \frac{l(l-L)}{2L^2} \langle x_0(k) \rangle_{R_0} + \frac{l}{L} \langle x_1(k) \rangle_{R_1} + \langle x_2(k) \rangle_{R_2} \right\}_R. \quad (23)$$

As can be seen, this overflow control in equation (23) is quite different from the conventional CIC filters of equation (22). Since the state variable $x_2(k)$ at the output of the second integrator stage is added to the integrator output without multiplying by any factors, the value of $R_2$ is still determined by the modulo of the input, $R_u$, and the overall gain of the filter, $(M/L)^3$, which is:

$$R_2 \geq R_u \left\lceil \left(\frac{M}{L}\right)^3 \right\rceil \quad (24)$$

where $\lceil x \rceil$ denotes the smallest integer greater or equal to x. In a practical implementation, the value of $R_2$ is usually chosen to be powers of 2 since the overflow control in this case means simply dropping the most significant bits above $\log_2(R_2)$. However, the selection of the value of $R_1$ is somewhat more difficult. If the value of $R_1$ is chosen to be the same as the value of $R_2$, the overflow in the state variable $x_1(k)$ would add $\pm R_2*1/L$ to the integrator output. Since $\pm R_2*1/L$ is not an integer multiple of $R_2$, it is not possible to be canceled out in the modulo system. One simple solution is to let $R_1 = L*R_2$ so that after multiplying with $1/L$, the overflow in $x_1(k)$ is always an integer multiple of $R_2$.

Similarly, it is possible to let $R_0 = 2*L^2*R_2$ in order to avoid adding non-integer multiple of $R_2$ to the result. When the values of $R_2$ and L are powers of 2, $R_1$, and $R_0$ will also be powers of 2. Thus, the number system overflows by dropping the most significant bits above the limit of each modulo. However, when $R_2$ or L is not powers of 2, each state variable needs to be compared with its respective modulo and then subtract the modulo from it when the number system overflows.

By examining equation (23), it is realized that another important consideration is quantization noise in the integrator output. The level of this noise can be adjusted by changing the wordlength of the integrator output, i.e., $$\left\{ Q \left[ \frac{l(l-L)(l-2L)}{6L^3} \langle u(k) \rangle_{R_u} + \frac{l(l-L)}{2L^2} \langle x_0(k) \rangle_{R_0} + \frac{1}{L} \langle x_1(k) \rangle_{R_1} + \langle x_2(k) \rangle_{R_2} \right] \right\}_R, \quad (25)$$

where Q determines the rounding accuracy of the summation. In order to cancel out the overflow, it is now required that $R = QR_2$. The value of Q is often chosen to be powers of 2 because of the implementation benefit that was mentioned earlier. However, when L is not powers of 2, for example, 3, the value of Q could be selected to be powers of 3 so that a division by 3 can be avoided when calculating equation (25). The differentiators in the CIC filter acts as a high-pass filters for the quantization noise, which further reduces the quantization noise in low frequencies. For high order CIC filters, this effect can be significant. If the signal content is concentrated in low frequencies, as in most delta-sigma modulators, this fact facilitates in the reduction of the required wordlength of the integrator output.

Figure 6:
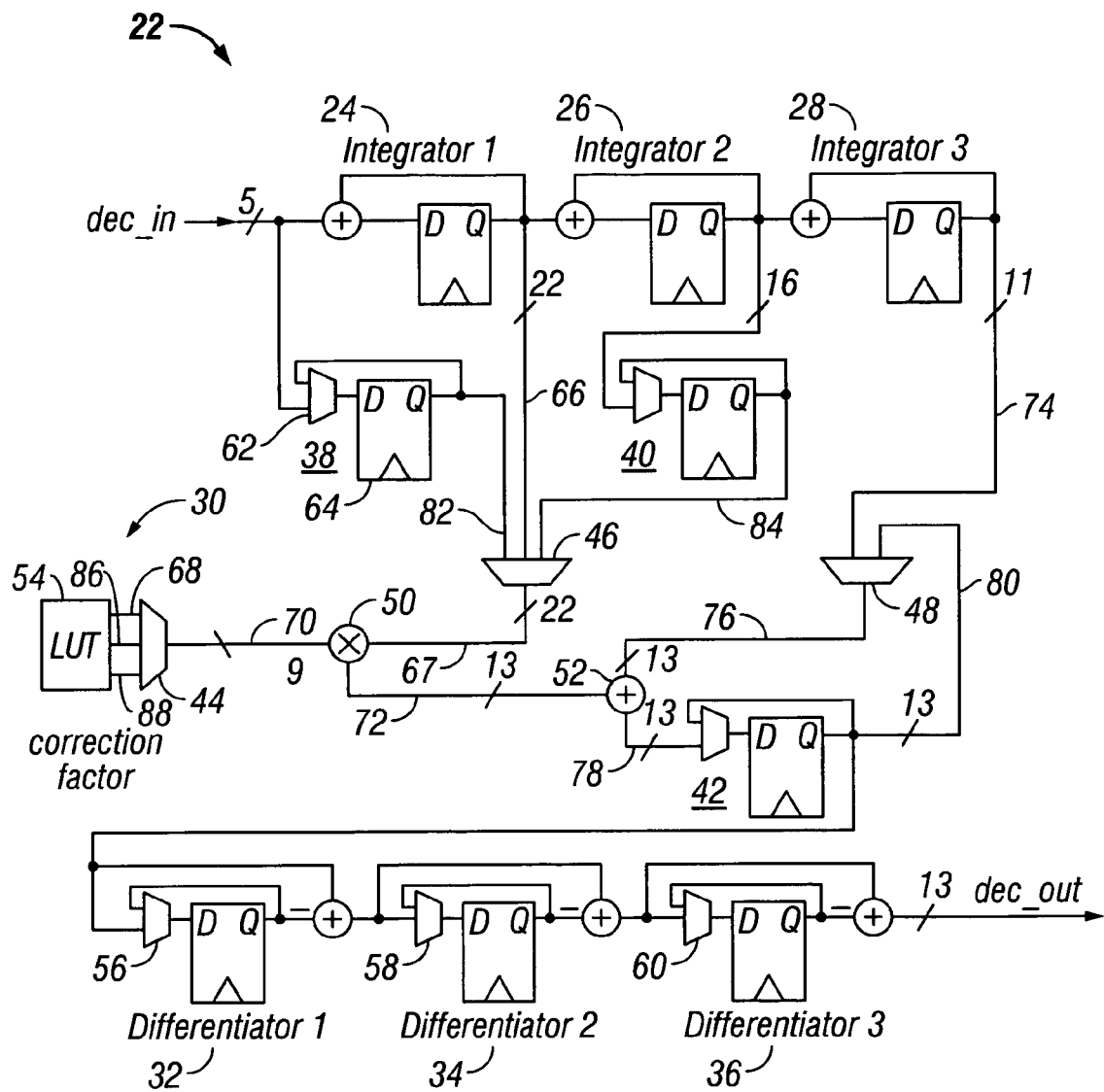
FIG. 6 is a circuit implementation of a 3-rd order non-integer decimation filter according to the present invention.

In FIG. 6, there is shown a block diagram of a circuit implementation of a 3-rd order CIC decimation filter in accordance with the present invention. The CIC decimation filter 22 includes three cascaded integrator stages 24, 26 and 28; a calculation network 30; and three cascaded differentiator stages 32, 34 and 36.

The calculation network 30 consist of first, second and third storage devices 38, 40 and 42; first, second and third multiplexers 44, 46 and 48; a multiplier 50; a summer or adder 52; a storage device such as a ROM or synthesizable logic 54 for storing a look-up table; and multiplexers 56–60. Each of the storage devices 38–42 is comprised of a multiplexer 62 and a latch 64.

The operation of the third order non-integer CIC decimation filter 22 will now be explained in connection with a decimation ratio of 125/32, where 32 is the interpolation factor and 125 is the decimation factor. The sequence of digital input values dec_in is a 5-bit data stream. The wordlength at the output of the third integrator stage 28 is initially chosen to be:

$$\left\lceil \log_2 \left( 2^5 \left\lceil \frac{125^3}{32^3} \right\rceil \right) \right\rceil = 11. \quad (26)$$

Since the virtual upsampling or interpolation factor is 32, the wordlength at the output of the respective first and second integrator stages 24, 26 are $11 + \log_2(2*32^2) = 22$ and $11 + \log_2(32) = 16$. In order to obtain the desired level of performance, the third integrator output is truncated to 13 bits, i.e., Q=4. Since the decimation ratio in this instance is larger than 3, this means that there are at least 3 cycles available to generate each decimated output dec_out, a sequence of digital output values.

In the first cycle, the output of first integrator stage 24 on line 66 passed through the second multiplexer 46 to line 67 and is multiplied by the multiplier 50 with its corresponding coefficient on line 68 from the ROM 54, which is passed through the first multiplexer 44 to line 70. The output of the multiplier 50 on line 72 is added together by the summer 52 with the output of third integrator stage 28 on line 74, which is passed through the third multiplexer 48 to line 76. The output of the summer on line 78 is sent to the third storage device 42 and is stored on its output on line 80. Simultaneously, the decimator input is stored at the output of first storage device 38 on line 82 and the output of second integrator stage 26 on line 84 is stored at the output of the second storage device 40 in the first cycle.

In the second cycle, the decimator input stored on line 82 is passed through the multiplexer 46 and multiplied by the multiplier 50 with its corresponding coefficient on line 86 from the ROM 54, which is passed through the first multiplexer 44. This time the output of the multiplier 50 is added by summer 52 with the information stored in the memory device 42 from the first cycle. The output of the summer on the line 78 is again stored on the output of the storage device 42. Similarly, in the third cycle, the output of the second integrator stage 26 stored on line 84 is passed through the multiplexer 46 and multiplied by the multiplier 50 with its corresponding coefficient on line 88 from the ROM 54, which is passed through the first multiplexer 44. This time the output of the multiplier 50 is added by summer 52 with the information stored in the memory device 42 from the second cycle. The output of the summer on the line 78 is again stored on the output of the storage device 42. These intermediate results accumulated in the memory device 42 are then sent to the three differentiator stages 32–36 via the multiplexers 56–60 to generate the decimated output dec_out.

The non-integer CIC decimation filter of the present invention has the following advantages over the prior art as follows:

(1) it has low complexity state variable update equations;
(2) it has much smaller gain so as to significantly reduce the wordlength; and
(3) it allows for a flexible trade-off between complexity and performance.

From the foregoing detailed description, it can thus be seen that the present invention provides a non-integer decimation filter for decimating an input value, which eliminates the need to apply corrections to the state variables of the integrators in the input sample domain. As a result, the decimation filter can realize non-integer decimation by utilizing low complexity virtual upsampling and can be implemented with relatively low computational complexity.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

APPENDIX

In this appendix, we provide a simple example to clearly illustrate the difference between our approach and the one by Henker et al. In this example, we used a 3rd CIC filter to realize a decimation ratio of 5/4. Table 1 compares the state update equations and the output calculation networks for each approach. The input to the decimator is represented by u(k). The state variables of the integrators are represented by $x_0(k)$, $x_1(k)$, and $x_2(k)$. They are updated at the input sample rate (nominally high speed). Since the virtual upsampling factor is 4, the calculation network has 4 sets of coefficients corresponding to each branch after virtual upsampling. The four branches are numbered as 0, 1/4, 2/4, and 3/4. At the output sample rate (nominally low speed), one branch is selected and sent to the differentiator. Which branch to select is determined by the decimation ratio 5/4. From Table 1, one can clearly see that our integrators are true integrators, unlike the integrators used in Henker et al, which have a complex correction network in the input sample domain.

TABLE 1

Comparison of a 3rd CIC filter with decimation ratio 5/4.

| Henker et al | Our approach |
| --- | --- |
| State update equation Updated at input sample rate | |
| $x_0(k) = x_0(k-1) + 4u(k-1)$ | $x_0(k) = x_0(k-1) + u(k-1)$ |
| $x_1(k) = 4x_0(k-1) + x_1(k-1) + 6u(k-1)$ | $x_1(k) = x_0(k-1) + x_1(k-1)$ |
| $x_2(k) = 6x_0(k-1) + 4x_1(k-1) + x_2(k-1) + 4u(k-1)$ | $x_2(k) = x_1(k-1) + x_2(k-1)$ |
| Output from calculation network | |
| $x_2(k+0) = x_2(k)$ | $x_2(k+0) = x_2(k)$ |
| $x_2(k+1/4) = x_1(k) + x_2(k)$ | $x_2(k+1/4) = -3/32\, x_0(k) + 1/4 x_1(k) + x_2(k)$ |
| $x_2(k+2/4) = x_0(k) + 2x_1(k) + x_2(k)$ | $x_2(k+2/4) = -1/32 x_0(k) + 2/4 x_1(k) + x_2(k)$ |
| $x_2(k+3/4) = 3x_0(k) + 3x_1(k) + x_2(k)$ | $x_2(k+3/4) = -3/32 x_0(k) + 3/4 x_1(k) + x_2(k)$ |

The invention claimed is:

1. A non-integer decimation filter for decimating an input value, comprising:
   a first integrator for integrating the input value in an input sample domain at an input sample rate and for generating a first integral of the input value at an output of the first integrator;
   a second integrator for integrating the first integral of the input value in the input sample domain at the input sample rate and for generating a second integral at an output of the second integrator;
   a calculation network coupled to the outputs of said first and second integrators for combining the outputs of said first and second integrals with corresponding coefficients to generate intermediate output values in an output sample domain; and
   a differentiator configured to receive the intermediate output values from said calculation network and to generate a decimated output value at an output sample rate in which the output sample rate has a non-integer factor with respect to the input sample rate.

2. A non-integer decimation filter as claimed in claim 1, wherein the non-integer factor is defined by a decimation ratio M/L, where L is an interpolation factor of a positive integer and M is a decimation factor of a positive integer.

3. A non-integer decimation filter as claimed in claim 2, wherein said calculation network includes a multiplier device for multiplying the outputs in the output sample domain of said first and second integrators with said corresponding coefficients and a summer for adding them together to generate the intermediate output values.

4. A non-integer decimation filter as claimed in claim 3, wherein the corresponding coefficients in said calculation network is determined by the value of L in said decimation ratio and the gain of the first and second integrators is determined by the value of M in said decimation ratio.

5. A non-integer decimation filter as claimed in claim 1, wherein said calculation network is configured to adjust the non-integer factor in the decimation filter.

6. A non-integer decimation filter as claimed in claim 5, wherein said calculation network includes a look-up table, which is used to determine said corresponding coefficients for adjusting the non-integer factor.

7. A non-integer decimation filter as claimed in claim 1, further comprising a third integrator and wherein said differentiator is of a third order.

8. A non-integer decimation filter as claimed in claim 7, wherein said first through third integrators are cascaded together and said differentiator is formed of three cascaded differentiator stages.

9. A non-integer decimation filter as claimed in claim 8, wherein said calculator network is formed of a first storage device for storing the input value, a second storage device for storing the output of the second integrator, and a third storage device for accumulating the intermediate output values which are passed to said three cascaded differentiator stages for generating the decimated output value.

10. A non-integer decimation filter for decimating an input value, comprising:
    an integrator being formed of at least a first integrator stage and a second integrator stage;
    said first integrator stage for integrating the input value in an input sample domain at an input sample rate and for generating a first integral of the input value at its output;
    said second integrator stage for integrating the first integral of the input value in the input sample domain at the input sample rate and for generating a second integral at its output;
    a calculation network coupled to the outputs of said first and second integrator stages for combining the outputs of said first and second integrator stages with corresponding coefficients to generate intermediate output values in an output sample domain; and
    a differentiator configured to receive the intermediate output values from said calculation network and to generate a decimated output value at an output sample rate in which the output sample rate has a non-integer factor respect to the input sample rate.

11. A non-integer decimation filter as claimed in claim 10, wherein said integrator is of an n-th order.

12. A non-integer decimation filter as claimed in claim 11, wherein said differentiator is of an n-th order.

13. A non-integer decimation filter as claimed in claim 10, wherein the non-integer factor is defined by a decimation ratio M/L, where L is an interpolation factor of a positive integer and M is a decimation factor of a positive integer.

14. A non-integer decimation filter as claimed in claim 13, wherein said calculation network includes a multiplier device for multiplying the outputs in the output sample domain of said n-th order integrator with said corresponding coefficients and a summer for adding them together to generate the intermediate output values.

15. A non-integer decimation filter as claimed in claim 14, wherein the corresponding coefficients is determined by the value of L in said decimation ratio and the gain of the n-th order integrator is determined by the value of M in said decimation ratio.

16. A non-integer decimation filter as claimed in claim 10, wherein said calculation network is configured to adjust the non-integer factor in the decimation filter.

17. A non-integer decimation filter as claimed in claim 16, wherein said calculation network includes a look-up table, which is used to determine said corresponding coefficients for adjusting the non-integer factor.

18. A non-integer decimation filter as claimed in claim 10, wherein said input value is a 5-bit data stream and said decimated output value is a 13-bit data stream.

19. A method for decimating an input value, comprising:
    integrating at a first integrator the input value in an input domain at an input sample rate to generate a first integral of the input value at its output;
    also integrating at a second integrator the first integral of the input value in the input domain at the input sample rate to generate a second integral at its output;
    coupling the outputs of the first and second integrators with a calculation network to generate intermediate output values in an output sample domain; and
    receiving the intermediate output values from the calculation network at a differentiator to generate a decimated output value at an output sample rate in which the output sample rate has a non-integer factor with respect to the input sample rate.

20. A method for decimating an input value as claimed in claim 19, further including the step of selectively inputting coefficients from the calculation network to adjust the non-integer factor.

* * * * *

UNITED STATES PATENT AND TRADEMARK OFFICE
CERTIFICATE OF CORRECTION

PATENT NO. : 7,196,648 B1
APPLICATION NO. : 11/317546
DATED : March 27, 2007
INVENTOR(S) : Lei Ding et al.

It is certified that error appears in the above-identified patent and that said Letters Patent is hereby corrected as shown below:

On the front page, in the left column, under (75), change "Xaiofan" to -- Xiaofan --.

Column 5, change equation (9) to read as follows:

$$-- \quad \left|H(e^{j\omega})\right| = \left|\frac{\sin\frac{M\omega}{2}}{\sin\frac{\omega}{2}}\right|^3 \left|\frac{\sin\frac{L\omega}{2}}{\sin\frac{\omega}{2}}\right| \quad --$$

Column 8, line 39, change "$<\mathbf{X}>_r$" to -- $<x>_r$ --.

Column 10, line 23, change "125" to -- 125 --.

Column 12, in Table I, under "Output from alculation network", change the second equation on the left side to read as follows:

$$-- \quad x_2(k+\tfrac{1}{4}) = x_1(k) + x_2(k) \quad --$$

Signed and Sealed this

Twelfth Day of June, 2007

JON W. DUDAS
*Director of the United States Patent and Trademark Office*